United States Patent
Murugan et al.

(10) Patent No.: US 9,666,553 B2
(45) Date of Patent: May 30, 2017

(54) MILLIMETER WAVE INTEGRATED CIRCUIT WITH BALL GRID ARRAY PACKAGE INCLUDING TRANSMIT AND RECEIVE CHANNELS

(71) Applicant: TEXAS INSTRUMENTS INCORPORATED, Dallas, TX (US)

(72) Inventors: Rajen Manicon Murugan, Garland, TX (US); Minhong Mi, Newton Center, MA (US); Gary Paul Morrison, Garland, TX (US); Jie Chen, Denton, TX (US); Kenneth Robert Rhyner, Rockwall, TX (US); Stanley Craig Beddingfield, Austin, TX (US); Chittranjan Mohan Gupta, Richardson, TX (US); Django Earl Trombley, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 32 days.

(21) Appl. No.: 14/740,190

(22) Filed: Jun. 15, 2015

(65) Prior Publication Data
US 2015/0364816 A1 Dec. 17, 2015

Related U.S. Application Data

(60) Provisional application No. 62/012,712, filed on Jun. 16, 2014.

(51) Int. Cl.
*H01Q 1/00* (2006.01)
*H01L 23/00* (2006.01)
(Continued)

(52) U.S. Cl.
CPC ........ *H01L 24/48* (2013.01); *H01L 23/49827* (2013.01); *H01L 23/49838* (2013.01); *H01L 23/66* (2013.01); *H01Q 1/2283* (2013.01); *H01Q 23/00* (2013.01); *H05K 1/0222* (2013.01); *H01L 2223/6611* (2013.01); *H01L 2223/6627* (2013.01); *H01L 2223/6655* (2013.01); *H01L 2223/6677* (2013.01);
(Continued)

(58) Field of Classification Search
CPC .................. H01Q 23/00; H01Q 1/2283; H01L 2223/6611; H01L 2224/48091; H01L 2223/6655; H01L 2224/8227
USPC ........................................................ 343/905
See application file for complete search history.

(56) References Cited

U.S. PATENT DOCUMENTS 5,717,245 A * 2/1998 Pedder .............. H01L 23/49816
257/664
7,859,835 B2 * 12/2010 Puzella .................... H01Q 1/02
165/104.33
(Continued)

*Primary Examiner* — Jean B Jeanglaude
(74) *Attorney, Agent, or Firm* — Jacqueline J. Garner; Charles A. Brill; Frank D. Cimino

(57) ABSTRACT

A millimeter wave integrated circuit (IC) chip. The IC chip comprises an IC die and a wire bond ball grid array package encapsulating the IC die. The wire bond ball grid array package comprises a solder ball array, a millimeter wave transmit channel, and a millimeter wave receive channel, wherein each millimeter wave transmit and receive channel electrically couples the IC die to a signal ball of the solder ball array and is configured to resonate at an operating frequency band of the millimeter wave IC chip.

20 Claims, 2 Drawing Sheets

(51) Int. Cl.
*H01L 23/66* (2006.01)
*H01L 23/498* (2006.01)
*H01Q 1/22* (2006.01)
*H01Q 23/00* (2006.01)
*H05K 1/02* (2006.01)

(52) U.S. Cl.
CPC ............... *H01L 2223/6683* (2013.01); *H01L 2224/48091* (2013.01); *H01L 2224/48106* (2013.01); *H01L 2224/48227* (2013.01); *H01L 2924/00014* (2013.01); *H01L 2924/1423* (2013.01); *H01L 2924/15311* (2013.01); *H01L 2924/30111* (2013.01); *H05K 2201/09609* (2013.01); *H05K 2201/10734* (2013.01)

(56) References Cited

U.S. PATENT DOCUMENTS

| | | | | |
|---|---|---|---|---|
| 8,040,199 B2 * | 10/2011 | Carr | ........................ | H01P 1/387 333/1.1 |
| 8,508,943 B2 * | 8/2013 | Danello | ............. | H01Q 21/0087 343/700 MS |
| 2014/0050283 A1 * | 2/2014 | Leiba | .................... | H01Q 13/22 375/298 |
| 2015/0008565 A1 * | 1/2015 | Yasooka | ............... | H01L 23/552 257/659 |
| 2015/0346322 A1 * | 12/2015 | Schmalenberg | .......... | G01S 7/02 342/175 |

* cited by examiner

US 9,666,553 B2

MILLIMETER WAVE INTEGRATED CIRCUIT WITH BALL GRID ARRAY PACKAGE INCLUDING TRANSMIT AND RECEIVE CHANNELS

CROSS-REFERENCE TO RELATED APPLICATIONS

The present application claims priority to U.S. Provisional Patent Application No. 62/012,712, filed Jun. 16, 2014, titled "Low Cost Package Solution for Millimeter Wave Applications," which is hereby incorporated herein by reference in its entirety.

BACKGROUND

Continued advances in semiconductor manufacturing technologies in recent years have made it possible to develop monolithic microwave integrated circuits (MMICs) using standard CMOS processes at a relatively low cost. However, it remains a challenge to develop suitable and affordable techniques for interconnects and packaging of these MMICs. Cost and packaging protection may be concerns. MMICs may be useful, for example, in radar systems. To be commercially viable for consumer applications such as in automobiles, a radar system would have to be of fairly low cost. Further, some environments in which MMICs might be useful may be fairly harsh. Such environments may be characterized by moisture, chemicals, and wide temperature swings.

SUMMARY

In an embodiment, a millimeter wave integrated circuit (IC) chip is disclosed. The IC chip comprises an IC die and a wire bond ball grid array package encapsulating the IC die. The wire bond ball grid array package comprises a solder ball array, a millimeter wave transmit channel, and a millimeter wave receive channel, wherein each millimeter wave transmit and receive channel electrically couples the IC die to a signal ball of the solder ball array and is configured to resonate at an operating frequency band of the millimeter wave IC chip.

In an embodiment, a millimeter wave integrated circuit (IC) chip is disclosed. The millimeter wave IC chip comprises an IC die and a wire bond ball grid array two metal layer package encapsulating the IC die. The wire bond ball grid array two metal layer package comprises a solder ball array and a millimeter wave channel that connects the IC die to a signal ball of the solder ball array. The channel comprises a signal bond wire coupled to the IC die, a metal trace coupled to the signal bond wire, a signal via coupled to the metal trace and to the signal ball, a plurality of ground vias coupled to a ground metal layer of the package, wherein the signal bond wire is configured to have a predetermined inductive reactance at an operating frequency band of the IC chip, wherein the signal via is configured to have a predetermined capacitive reactance at the operating frequency band of the IC chip, and wherein the capacitive reactance and the inductive reactance are substantially equal in amplitude but opposite in sign over the operating frequency band of the IC chip.

In an embodiment, a millimeter wave printed circuit board is disclosed. The millimeter wave printed circuit board comprises a millimeter wave integrated circuit (IC) chip, a printed circuit board substrate, and an antenna coupled to the IC chip via a transmission line formed on the printed circuit board. The millimeter wave IC chip comprises an IC die and a wire bond ball grid array package encapsulating the IC die. The wire bond ball grid array package comprises a solder ball array and a millimeter wave channel, wherein the millimeter wave channel electrically couples the IC die to a signal ball of the solder ball array and is configured to resonate at an operating frequency band of the IC chip. The antenna coupled to the IC chip via a transmission line formed on the printed circuit board substrate that couples to the signal ball.

These and other features will be more clearly understood from the following detailed description taken in conjunction with the accompanying drawings and claims.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

A monolithic microwave integrated circuit (MMIC) die encapsulated in a wire bond fine pitch ball grid array (FBGA) two metal layer package is taught by the present disclosure. It is understood that a ball grid array package comprises a solder ball array that provides for connection to a printed circuit board or other circuit. Solder balls of the solder ball array may provide signal connections, ground connections, and power connections. In the past, MMIC chips have relied upon different, more expensive packaging solutions, for example embedded wafer level ball grid array (eWLB) packaging. Traditional approaches for connecting the MMIC die pads to the package pins of an FBGA or a new FBGA (nFBGA) package may suffer from excessive insertion losses or signal strength attenuation that result from various parasitics and/or reactances that develop at the operating frequency band of the MMIC chip. The present disclosure teaches designing and manufacturing the package connection structures to create a resonant circuit at an operating frequency band of a MMIC. In one example the operating frequency band of the MMIC may be in the range of 76 GHz to 81 GHz which may be useful in an automobile-based radar system. The operating frequency band of the MMIC can be other than 76 GHz to 81 GHz in other examples.

The extremely high frequency (EHF) electromagnetic band of radio frequencies defined by the International Telecommunication Union (ITU) extends from 30 GHz to 300 GHz, corresponding to wavelengths that range from about 10 millimeters down to 1 millimeter, where the electromagnetic waves are assumed to be propagating in free space. This frequency range may be referred to as the millimeter wave frequency range in some contexts. The microwave electromagnetic band of radio frequencies is considered by some to extend from 300 MHz to 300 GHz (wavelengths from 1 meter down to 1 millimeter, where the electromagnetic waves are assumed to be propagating in free space), thus, the microwave electromagnetic radio spectrum comprises within it the millimeter electromagnetic radio spectrum.

Figure 1:
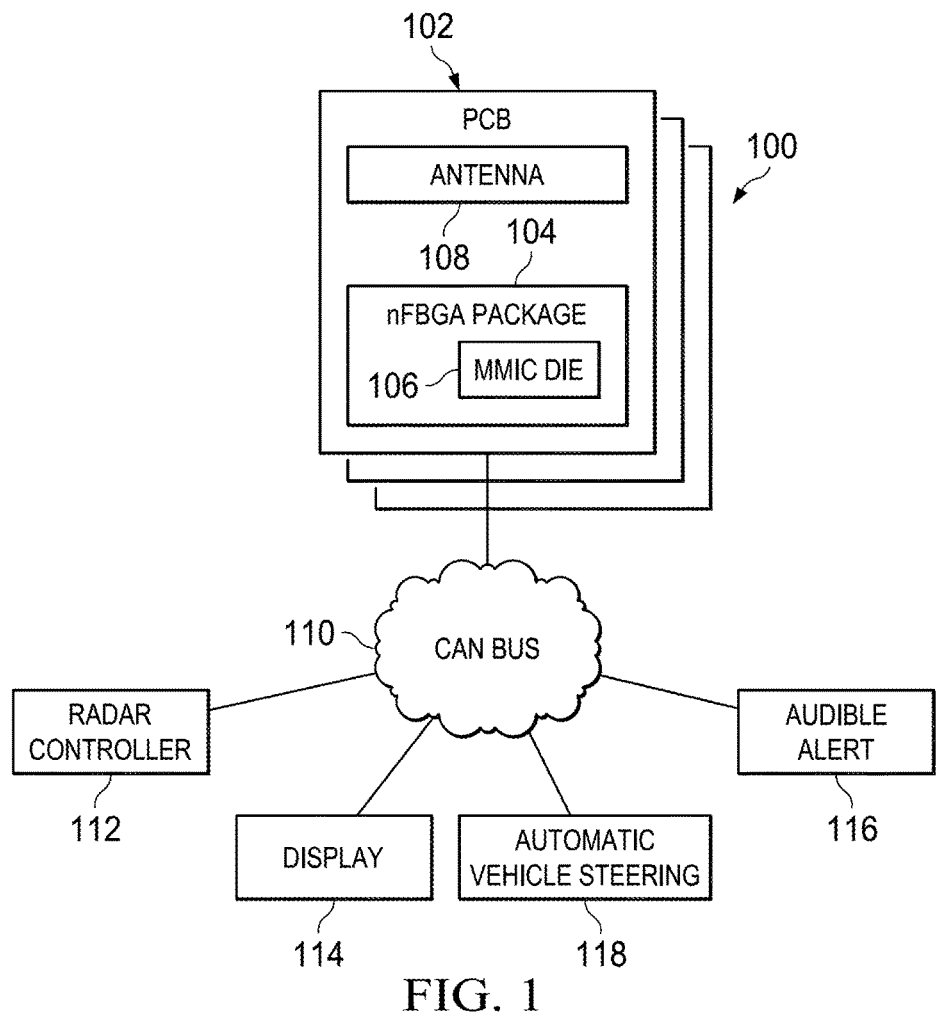
FIG. 1 shows an automobile radar system in accordance with various examples.

FIG. 1 shows an example of a system 100 that comprises a printed circuit board (PCB) 102 having an antenna 108 and wire bond ball grid array (BGA) package 104 encapsulating a MMIC die 106. In an embodiment, the wire bond BGA package 104 may be a wire bond fine-pitch ball grid array (FBGA) package or a wire bond new fine-pitch ball grid array (nFBGA) package. In some contexts, the wire bond BGA package 104 may be referred to as a millimeter wave integrated circuit chip. The PCB 102 may be used as, or as part of, a radar system used in a vehicle such as an automobile. The vehicle may desirably deploy a plurality of radar PCBs 102 at different locations around the perimeter of the vehicle to promote collision avoidance. In some cases, as many as 30 or more PCBs 102 may be deployed in a vehicle radar system. The system further comprises a controller area network (CAN) bus 110 that communicatively couples the PCBs 102 to one or more of a radar controller 112, a display 114, an audible alert 116 device, and/or an automatic vehicle steering controller 118.

The wire bond BGA package 104 or MMIC chip emits a radar signal, and the antenna 108 radiates the radar signal. If an object is near, the radiated radar signal may reflect off the object and be received by the antenna 108. The wire bond BGA package 104 may receive the reflected radar signal from the antenna 108, and the MMIC die 106 may process the reflected radar signal. The MMIC die 106 may provide radar functionality and/or automobile radar functionality in some contexts. The MMIC die 106 transmits digital information about the radar signal or radar return to the CAN bus 110.

The radar controller 112 receives the information from the CAN bus 110, processes the information, and determines that a collision is impending. In this situation, the radar controller 112 may send a warning or notification to the display 114, for example commanding the display 114 to present an eye catching signal (the display 114 may be located in the center of the dashboard of the vehicle), and/or to the audible alert component 116 to sound an audible warning or alert. In an embodiment, the radar controller 112 may send a command to the automatic vehicle steering and braking controller 118 to take action to avoid the collision, for example to steer away from the impending collision. Such collision avoidance steering commands may be conditioned on the radar controller 112 determining, based on inputs from other PCBs 102, that steering away from the impending collision does not steer into a different collision situation. It is understood that the wire bond BGA package 104 taught herein may advantageously be used in other systems and designs, unrelated to automobile radars, that rely on a narrowband MMIC die 106. While an automobile radar MMIC is an exemplary embodiment of the teachings of the present disclosure, it is understood that application of these teachings to other non-automotive and non-radar applications is consistent with and contemplated by the present disclosure.

Figure 2:
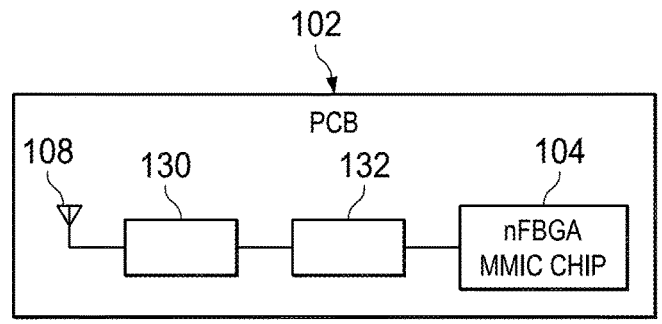
FIG. 2 shows a printed circuit board in accordance with various examples.

Turning now to FIG. 2, details of the PCB 102 are described. In an embodiment, the PCB 102 may comprise the wire bond BGA package 104 coupled to a millimeter wave matching network 132 which itself is coupled to a millimeter wave transmission line 130. The transmission line 130 is coupled to the antenna 108. In some examples, the wire bond BGA package 104 may be referred to as a millimeter wave integrated circuit chip. In some embodiments, the wire bond BGA package 104 may be implemented as a wire bond package, for example a ball grid array wire-bond package such as a wire bond fine-pitch ball grid array package. The PCB 102 may comprise a plurality of millimeter wave matching networks 132 each coupled a millimeter wave transmission lines 130 that couple different channels of the PCB 102 to the antenna 108 or to multiple different antennas 108. Alternatively, a multiplexer (not shown) may selectively switch different channels of the PCB 102 to the matching network 132, to the transmission line 130, and to the antenna 108. The matching network 132 may present an impedance to the wire bond BGA package 104 that promotes improved power transfer from the wire bond BGA package 104 to the antenna 108 (in transmit mode) or from the antenna 108 to the wire bond BGA package 104 (in receive mode). In an embodiment, the matching network 132 may present a 50 ohm impedance to the wire bond BGA package 104, although the impedance may be different than 50 ohms in other implementations.

Figure 3:
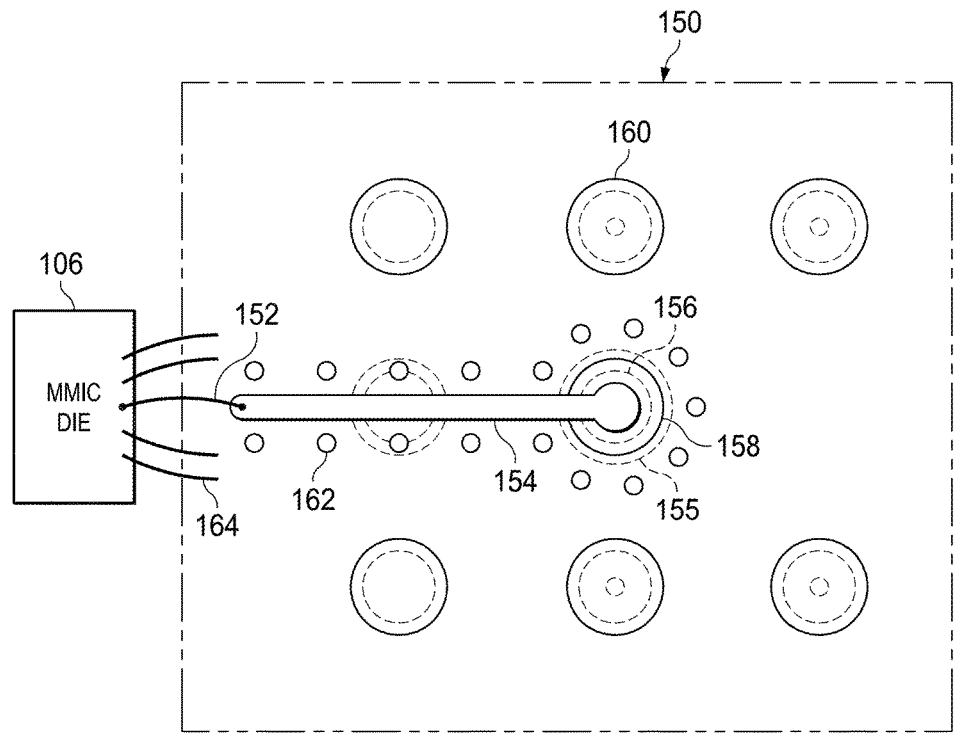
FIG. 3 shows a channel of a millimeter wave integrated circuit chip in accordance with various examples.

Turning now to FIG. 3, details of a single millimeter wave channel 150 of the wire bond BGA package 104 are described. This channel 150 may be a transmit channel that transmits millimeter wave signals from the MMIC die 106 to a signal solder ball output of the wire bond BGA package 104 and hence to the PCB 102 and the antenna 108. Alternatively the channel 150 may be a receive channel that receives millimeter wave signals at a signal solder ball input of the wire bond BGA package 104 (e.g., from the antenna 108 via the transmission line 130 and matching network 132 of the PCB 102) and propagates the received millimeter wave signals to the MMIC die 106. In either case, the channel 150 may comprise a millimeter wave channel (e.g., a millimeter wave transmit channel or a millimeter wave receive channel) and may electrically couple the MMIC die 106 to the signal solder ball. In an embodiment, the wire bond BGA package 104 comprises a plurality of channels 150. In some embodiments, the various channels 150 are coupled to the same MMIC die 106 and not to separate MMIC dies 106. For example, in an embodiment, the wire bond BGA package 104 comprises at least three millimeter wave transmit channels and at least four millimeter wave receive channels. The MMIC die 106 may have other connections (not shown), for example digital data connections to the solder ball array. The digital data connections may transmit and/or receive baseband data signals, for example signals that are not modulated onto a radio frequency carrier wave. In an embodiment, the digital data connections may transmit and/or receive data signals that are not in the microwave frequency range.

Figure 4:
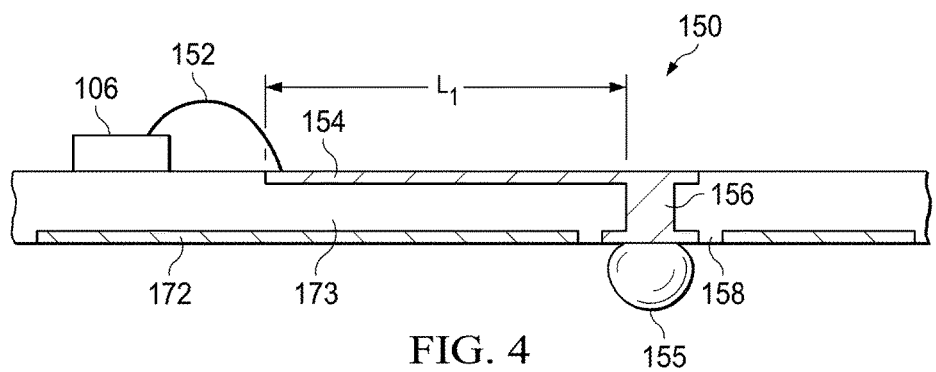
FIG. 4 shows a channel of a millimeter wave integrated circuit chip in section view in accordance with various examples.

The channel 150 from the MMIC die 106 to a signal solder ball 155 (best seen in FIG. 4) comprises a signal bond wire 152, a trace 154, and a signal via 156 that couples the trace to the signal solder ball. In an embodiment, the channel 150 may further be considered to comprise the signal solder ball 155. The signal via 156 is enclosed or protected by an antipad 158, wherein an antipad is the clearance between the barrel of the via and the ground metal layer (e.g., ground metal layer 172 as illustrated in FIG. 4). The channel 150 is configured to provide a resonant tuned channel in the operating frequency band of the MMIC die 106, for example in the frequency range 76 GHz to 81 GHz. In some contexts this may be referred to as a narrowband operating frequency band (e.g., where the operating bandwidth is less than 10% of the center frequency of the operating frequency band). In other words, the channel 150 is configured to resonate at the operating frequency band of the MMIC die 106. In other embodiments, the channel 150 may be configured to resonate in a different frequency range than the 76 GHz to 81 GHz range. In an embodiment, the channel 150 may achieve resonance only over a relatively narrow band of frequencies, because the electrical reactances in the channel 150 may not be balanced appropriately outside of a narrow frequency band. Electrical reactance is the imaginary component of impedance and can affect alternating current (AC) signals.

At the channel resonance frequency, an inductive reactance presented by the signal bond wire 152 and a capacitive reactance presented by the signal via 156 and the solder ball 155 are about equal in amplitude and opposite in sign. The wire bond BGA package 104 may be built on a substrate that has two metal layers. The trace 154 may form a planar wave guide with a ground layer that is one of the two metal layers of the substrate. The length of the trace 154 is configured to be equal to an integer multiple of half the wavelength of the operating frequency band of the MMIC die 106 (e.g., at the center of the operating frequency band, where the wavelength is based on the speed of electromagnetic wave propagation in a substrate of the channel 150 and/or a dielectric between the metal trace and the ground metal layer).

In an embodiment, the channel 150 comprises a plurality of grounded bond wires 164 proximate to and on either side of the signal bond wire 152. The grounded bond wires 164 at least a partially shield the signal bond wire 152 from spurious electromagnetic waves (e.g., radio interference). The channel 150 may also comprise a plurality of ground vias connected to solder balls 160. In FIG. 3, four ground vias connected to solder balls are illustrated, but in another embodiment a different number of ground vias connected to solder balls may be employed. The channel 150 may also comprise a plurality of ground vias 162 that connect to a ground metal layer of the substrate. The plurality of ground vias 162 at least partially shield the trace 154 and the signal via 156 from spurious electromagnetic waves (e.g., radio interference).

Turning now to FIG. 4, further details of the millimeter wave channel 150 are described. The signal bond wire 152 is characterized by a length, a loop height, a cross sectional geometry, and a sweeping factor. The inductive reactance presented by the signal bond wire 152 at the operating frequency band of the MMIC is based at least in part on these characteristics, and the inductive reactance can be tuned and/or configured to a suitable value by adapting these characteristics. For example, the cross-sectional area of the signal bond wire 152 may be made smaller or larger. The cross-sectional dimensions can be made thinner in one dimension and wider in another dimension. In an embodiment, a loop area of the signal bond wire 152 can be varied to tune the inductive reactance. In an embodiment, the distance between the signal bond wire 152 and the proximate ground bond wires 164 may be adapted to tune the inductive reactance of the signal bond wire 152. The sweep factor is a value that represents an amount of variation resulting from the manufacturing process on the alignment of the signal bond wires 152 and the grounded bond wires 164.

A ground metal layer 172 is illustrated in FIG. 4. A space 173 between the trace 154 and the ground metal layer 172 forms a planar waveguide structure (e.g., structurally similar to a microstrip). The length $L_1$ of the trace 154 may be an integer multiple of a half wavelength of the center of the operating frequency band of the MMIC, where the wavelength takes into consideration the speed of wave propagation in the substrate of the MMIC. The propagation of electromagnetic waves in a substrate and/or dielectric of a semiconductor package may differ significantly from the speed of propagation of electromagnetic waves in free space and hence the wavelength too will vary between an electromagnetic wave propagating in a substrate versus propagating in free space. Some manufacturing variation in the length of the trace 154 from the ideal design length may be anticipated and is compatible with proper functioning of the MMIC and/or the millimeter wave channel 150.

A solder ball 155 is illustrated in FIG. 4 connected to the signal via 156. In operation, a millimeter wave signal may propagate from the die 106 over the bond wire 152 along the trace 154 to the signal via 156 and to the solder ball 156 that may be connected to the matching network 132 on the PCB 102. The various physical dimensions of the signal via 156 and the solder ball 155—for example, geometry and dimensions of the antipad 158, geometry and dimensions of the via pad, geometry and dimensions of the via barrel—may affect the capacitive impedance of the signal via 156 and solder ball 155.

Figure 5:
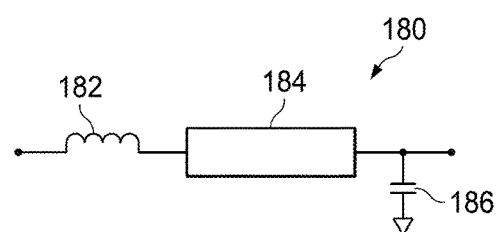
FIG. 5 shows a resonant circuit in accordance with various examples.

Turning now to FIG. 5, a circuit model 180 of the millimeter wave channel 150 is shown. The millimeter wave channel 150 can be modeled as an inductive reactance 182 in series with a transmission line 184, and the output of the transmission line 184 is connected to a capacitive reactance 186. The inductive reactance 182, represented in FIG. 5 by an electrical coil circuit symbol, represents the inductive reactance of the signal wire bond 152. It is understood that, in an embodiment, the inductive reactance 184 may be affected by the ground bond wires 162. The transmission line 184 represents the planar waveguide formed by the trace 154 and the ground metal layer 172. The capacitive reactance 186, represented in FIG. 5 by a capacitor circuit symbol, represents the capacitive reactance of the signal via 156 and connection to the signal solder ball 156. By controlling and/or designing the inductive reactance 182 and the capacitive reactance 186, the circuit model 180—and hence the millimeter wave channel 150—can be made to have a resonant frequency that matches the center frequency of the operating frequency band of the millimeter wave channel 150 and of the MMIC die 106. Resonance may occur when the inductive reactance 182 and the capacitive reactance 186 are equal in amplitude and opposite in sign at the center of the operating frequency band of the wire bond BGA package 104. It is understood by those skilled in the art that reactances change value as frequency changes. When the length of the transmission line 184 is equal to an integer multiple of half the wavelength of the center of the operating frequency band and the millimeter wave channel 150 resonates at the center of the operating frequency band of the MMIC die 106, higher insertion loss of the wire bond BGA package 104 may be achieved. In an embodiment, the insertion loss using the structures taught herein achieve less than a 2 dB insertion loss (e.g., an insertion loss greater than −2.0 dB, where −1.0 dB is greater [in a numeric sense, relative to 0] than −2.0 dB). The structures described above with reference to FIG. 3 and FIG. 4 such as grounded bond wires 164, ground vias 160, and ground vias 162 contribute to the control of insertion loss.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A millimeter wave integrated circuit (IC) chip, comprising:
    an IC die; and
    a wire bond ball grid array package encapsulating the IC die and comprising
        a solder ball array,
        a millimeter wave transmit channel, and
        a millimeter wave receive channel,
            wherein each millimeter wave transmit and receive channel electrically couples the IC die to a signal ball of the solder ball array and is configured to resonate at an operating frequency band of the millimeter wave IC chip.

2. The millimeter wave IC chip of claim 1, wherein the solder ball array is a wire bond fine-pitch ball array (FBGA).

3. The millimeter wave IC chip of claim 1, wherein the operating frequency band of the millimeter wave IC chip is in the range of 76 GHz to 81 GHz.

4. The millimeter wave IC chip of claim 1, wherein the wire bond ball grid array package comprises at least three millimeter wave transmit channels and at least four millimeter wave receive channels.

5. The millimeter wave IC chip of claim 1, wherein each millimeter wave transmit and receive channel comprises a metal trace having a length about an integer number of half-wavelengths of a center frequency of the operating frequency band, wherein the metal trace and a metal ground layer of the ball grid array package form a planar waveguide.

6. The millimeter wave IC chip of claim 5, wherein each millimeter wave transmit and receive channel comprises a signal bond wire coupled to the IC die and coupled to a first end of the metal trace and comprises a signal via coupled to a second end of the metal trace and coupled to a signal solder ball of the solder ball array, wherein an inductive reactance of the signal bond wire at the operating frequency band and a capacitive reactance of the signal via and signal solder ball at the operating frequency band are opposite in sign and about equal in magnitude.

7. The millimeter wave IC chip of claim 6, wherein each millimeter wave transmit and receive channel comprises a plurality of grounded bond wires proximate to the signal bond wire, coupled to the IC chip and coupled to the metal ground layer of the wire bond ball grid array package.

8. The millimeter wave IC chip of claim 6, wherein each millimeter wave transmit and receive channel comprises a plurality of ground vias coupled to ground solder balls of the solder ball array and a plurality of ground vias coupled to the metal ground layer of the wire bond ball grid array package.

9. A millimeter wave integrated circuit (IC) chip, comprising:
    an IC die; and
    a wire bond ball grid array two metal layer package encapsulating the IC die, wherein the wire bond ball grid array two metal layer package comprises
        a solder ball array and
        a millimeter wave channel that connects the IC die to a signal ball of the solder ball array,
            wherein the channel comprises
                a signal bond wire coupled to the die,
                a metal trace coupled to the signal bond wire,
                a signal via coupled to the metal trace and to the signal ball,
                a plurality of ground vias coupled to a ground metal layer of the wire bond ball grid array two metal layer package,
                wherein the signal bond wire is configured to have a predetermined inductive reactance at an operating frequency band of the IC chip,
                wherein the signal via is configured to have a predetermined capacitive reactance at the operating frequency band of the IC chip, and
                wherein the capacitive reactance and the inductive reactance are substantially equal in amplitude but opposite in sign over the operating frequency band of the IC chip.

10. The millimeter wave IC chip of claim 9, wherein the IC die provides radar functionality.

11. The millimeter wave IC chip of claim 10, wherein the IC die provides automobile radar functionality and where the operating frequency band of the IC chip is in the range from 76 GHz to 81 GHz.

12. The millimeter wave IC chip of claim 9, wherein a length of the metal trace coupled to the signal bond wire is configured to have a length equal to an integer number of half-wavelengths at the operating frequency band of the IC chip.

13. The millimeter wave IC chip of claim 9, wherein the solder ball array is a fine-pitch ball grid array (FBGA).

14. The millimeter wave IC chip of claim 9, wherein the millimeter wave IC is a monolithic microwave IC (MMIC) chip.

15. A millimeter wave printed circuit board, comprising:
    a millimeter wave integrated circuit (IC) chip comprising an IC die; and
    a wire bond ball grid array package encapsulating the IC die, wherein the package comprises
        a solder ball array and
        a millimeter wave channel,
            wherein the millimeter wave channel electrically couples the IC die to a signal ball of the solder ball array and is configured to resonate at an operating frequency band of the IC chip;
    a printed circuit board substrate; and
    an antenna coupled to the IC chip via a transmission line formed on the printed circuit board substrate that couples to the signal ball.

16. The millimeter wave printed circuit board of claim 15, wherein the millimeter wave channel is configured so an inductive reactance of the channel and a capacitive reactance of the channel are about equal in amplitude and opposite in sign at the operating frequency band of the IC chip.

17. The millimeter wave printed circuit board of claim 15, wherein the millimeter wave channel comprises a planar wave guide component that has a length equal to about an integer number of half-wavelengths of the operating frequency band of the IC chip, where the half-wavelength distance is based on a propagation speed of electromagnetic waves in the planar wave guide component.

18. The millimeter wave printed circuit board of claim 15, wherein the millimeter wave printed circuit board is an automotive radar printed circuit board.

19. The millimeter wave printed circuit board of claim 15, wherein the millimeter wave channel comprises a signal bond wire coupling the IC die to the signal ball and a plurality of grounded bond wires coupling the IC die to a ground metal layer of the wire bond ball grid array package.

20. The millimeter wave printed circuit board of claim 19, wherein the ground bond wires are located on both sides of the signal bond wire.

* * * * *